(12) United States Patent
Murali et al.

(10) Patent No.: US 6,248,951 B1
(45) Date of Patent: *Jun. 19, 2001

(54) DIELECTRIC DECAL FOR A SUBSTRATE OF AN INTEGRATED CIRCUIT PACKAGE

(75) Inventors: Venkatesan Murali; Nagesh Vodrahalli, both of San Jose; Brian A. Kaiser, Saratoga, all of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/225,270

(22) Filed: Jan. 5, 1999

(51) Int. Cl.[7] ................ H01L 23/28; H05K 5/06
(52) U.S. Cl. .......... 174/52.2; 257/704; 257/706; 257/778; 361/760; 361/764; 361/767
(58) Field of Search .......... 174/52.4; 257/778, 257/704, 706; 361/764, 760, 767

(56) References Cited

U.S. PATENT DOCUMENTS

| | | | |
|---|---|---|---|
| 5,737,191 | * | 4/1998 | Horiuchi et al. ............ 361/764 |
| 5,827,999 | * | 10/1998 | McMillan ............ 174/52.4 |
| 5,834,848 | * | 11/1998 | Iwasaki ............ 257/778 |

* cited by examiner

*Primary Examiner*—William A. Cuchlinski, Jr.
*Assistant Examiner*—Ronnie Mancho
(74) *Attorney, Agent, or Firm*—Blakely, Sokoloff, Taylor & Zafman LLP

(57) ABSTRACT

An integrated circuit package which may include a decal that is attached to a substrate which supports an integrated circuit. The decal may have a coefficient of thermal expansion that is different than a coefficient of thermal expansion of the substrate.

20 Claims, 2 Drawing Sheets

DIELECTRIC DECAL FOR A SUBSTRATE OF AN INTEGRATED CIRCUIT PACKAGE

BACKGROUND OF THE INVENTION

1. Field of the Invention

The present invention relates to an integrated circuit package.

2. Background Information

Integrated circuits are typically incorporated into packages that are soldered to a printed circuit board. There has been developed various types of integrated circuit packages including quad flat pack (QFP), ball grid array (BGA) and controlled collapsed chip connect (C4) packages. C4 packages include a plurality of solder bumps that interconnect the integrated circuit to a substrate. The integrated circuit may also be enclosed by an encapsulant. The substrate can be attached to a circuit board such as the motherboard of a computer.

During operation, the integrated circuit generates heat which raises the temperature of the package. Conversely, when power to the integrated circuit is terminated the temperature of the package returns to an ambient level. This thermal cycle causes the integrated circuit and the substrate to both expand and contract.

This expansion creates stresses in the substrate. The stresses can create cracks in the substrate surface and which may cause electrical connectivity problems if these cracks propagate through the underlying metal traces. Many C4 packages include an epoxy underfill material that surrounds the solder bumps. The underfill material is typically dispensed along one side of the integrated circuit and then flows between the circuit and the substrate under capillary forces. It is desirable to completely fill the space between the integrated circuit and the substrate with underfill material without having the material flow to an undesirable area of the package. It would be desirable to provide a feature in the integrated circuit package that will contain the underfill material during the dispensing process.

SUMMARY OF THE INVENTION

One embodiment of the present invention is an integrated circuit package which may include a decal that is attached to a substrate which supports an integrated circuit. The decal may have a coefficient of thermal expansion that is different than a coefficient of thermal expansion of the substrate.

DETAILED DESCRIPTION

Figure 1:
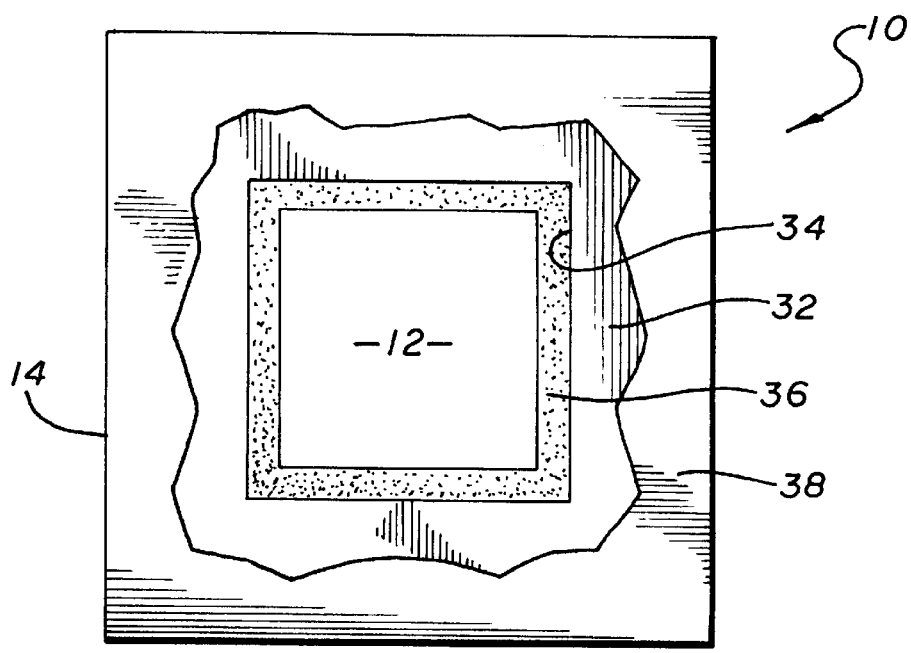
FIG. 1 is a top view of an embodiment of an integrated circuit package of the present invention.
Figure 2:
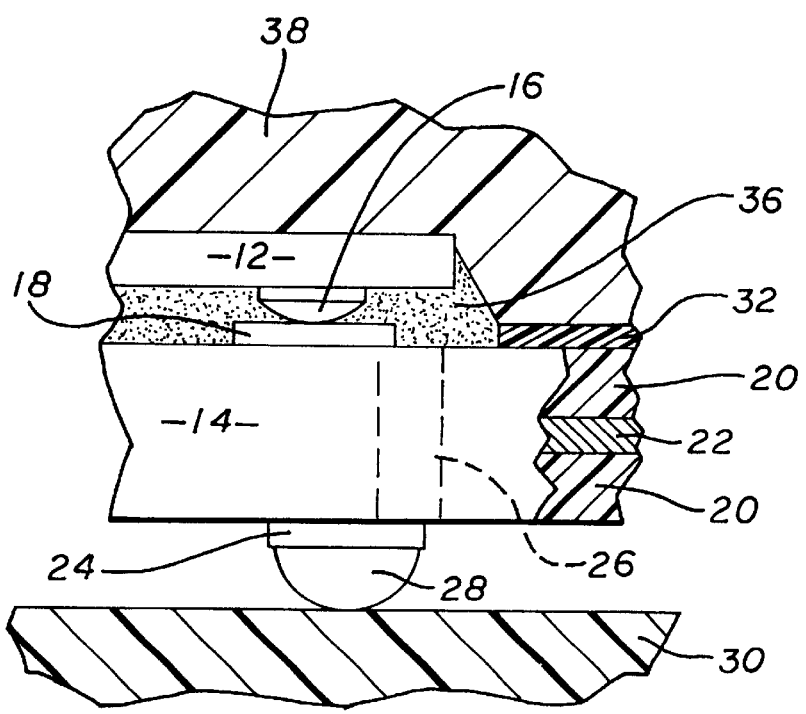
FIG. 2 is a side view of the integrated circuit package.

Referring to the drawings more particularly by reference numbers, FIGS. 1 and 2 show an embodiment of an integrated circuit package 10 of the present invention. The package 10 may include an integrated circuit 12 that is attached to a substrate 14. By way of example, the integrated circuit 12 may be a microprocessor. The circuit 12 may be connected to the substrate 14 by a plurality of solder bumps 16. The solder bumps 16 may be connected to corresponding surface pads 18 of the substrate 14 with a reflow process commonly referred to as controlled collapsed chip connect (C4).

The substrate 14 may be a laminated element which has layers of dielectric material 20 that separate one or more layers of conductive material 22. The substrate 14 may also have surface pads 24. The substrate 14 may further have vias 26 that extend through the dielectric material 20 to interconnect the conductive layers 22 and the pads 18 and 24. The layer(s) of conductive material 22 may include signal traces and power/ground planes that electrically connect the solder bumps 16 to the surface pads 24.

The package 10 may include a plurality of solder balls 28 that are attached to the surface pads 24. The solder balls 28 can be reflowed to attach the package 10 to a printed circuit board 30. By way of example, the circuit board 30 may be a motherboard of a computer system. Although solder balls 28 are shown and described, it is to be understood that the package 10 may have other types of contacts such as pins which extend from the substrate 14.

The package 10 may include a decal 32 that is attached to the substrate 14. The integrated circuit 12 typically has a lower coefficient of thermal expansion than the coefficient of thermal expansion of the substrate 14. The decal 32 may have a coefficient of thermal expansion that is lower than that of the substrate 14.

The decal 32 may have a center opening 34 which has an area that is larger than the area of the integrated circuit 12. The package 10 may have an underfill material 36 located between the integrated circuit 12 and the substrate 14. The underfill material 36 reduces the stresses on the solder bumps 16. The underfill material 36 may be an epoxy. The underfill material 36 may fill and be contained by the decal 32 within the center opening 34. The integrated circuit 12 may be enclosed by an encapsulant 38. The encapsulant 38 may be an injection molded material.

Figure 3A:
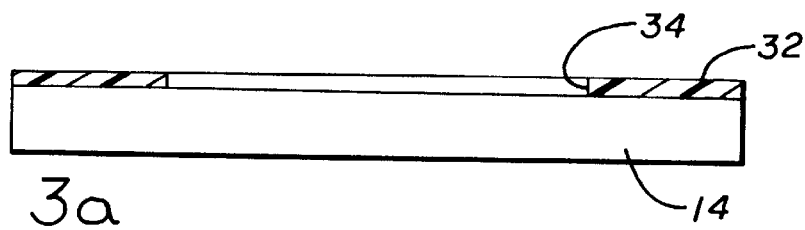
FIGS. 3a–d show a process for assembling the integrated circuit package.

FIGS. 3a–d show a process for assembling the package. The decal 32 can be attached to the substrate 14 as shown in FIG. 3a. The decal 32 may be attached with a screen printing technique. By way of example, the decal 32 may be a solder resist material that is screened onto the substrate 14 through a template (not shown). The resist is not applied in the center area to create the center opening 34. The resist is subsequently cured.

Figure 3B:
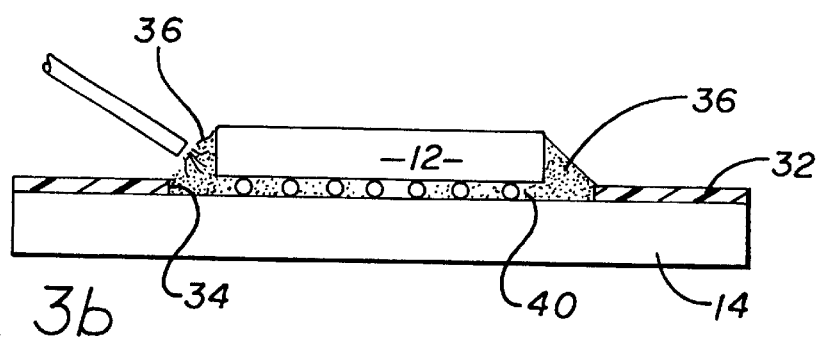

The integrated circuit 12 can be attached to the substrate 14 as shown in FIG. 3b. Attachment of the solder bumps 16 to the substrate 14 creates a space 40. The underfill material 36 may be dispensed into the space 40. The center opening 34 of the decal 32 creates a dam which limits the flow of the underfill material 36.

Figure 3C:
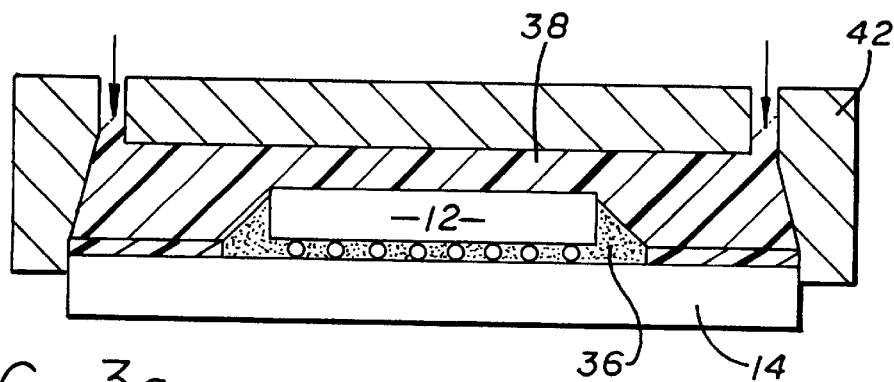
Figure 3D:
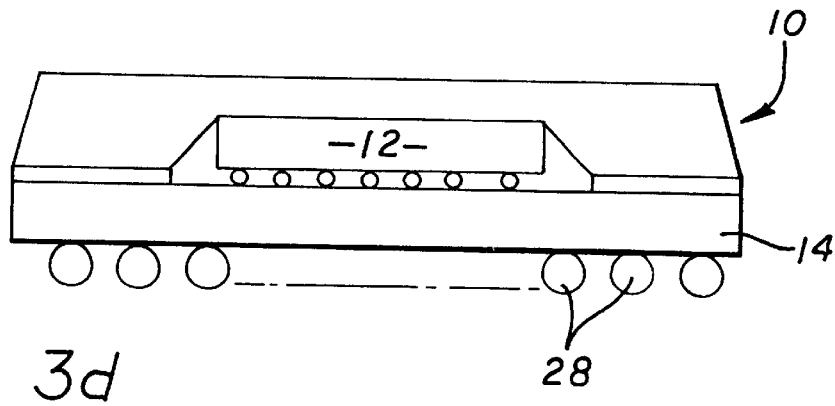

The underfill material is cured and the integrated circuit may be enclosed with an encapsulant 38 that is injected into a mold 42, as shown in FIG. 3c. As shown in FIG. 3d the solder balls 28 can then be attached to the substrate 14, typically with a reflow process, to complete the package 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package, comprising:

a substrate which has a substrate coefficient of thermal expansion;

a decal attached to said substrate, the decal having a decal coefficient of thermal expansion that is lower than said substrate coefficient of thermal expansion; and, an integrated circuit that is attached to said substrate.

2. The package of claim 1, further comprising a solder bump that attaches said integrated circuit to said substrate.

3. The package of claim 2, further comprising an underfill material that is located between said integrated circuit and said substrate.

4. The package of claim 3, wherein said decal has an opening which has an area that is larger than an area of said integrated circuit.

5. The package of claim 1, further comprising a solder ball that is attached to said substrate.

6. The package of claim 1, wherein said decal includes a solder resist material.

7. The package of claim 1, further comprising an encapsulant that encloses said integrated circuit.

8. An integrated circuit package, comprising:

a substrate;

a decal that is attached to said substrate, said decal has an opening and a coefficient of thermal expansion lower than a coefficient of thermal expansion of the substrate;

an integrated circuit that is attached to said substrate; and, an underfill material that is located within said decal opening between said integrated circuit and said substrate.

9. The package of claim 8, further comprising a solder bump that attaches said integrated circuit to said substrate.

10. The package of claim 8, further comprising a solder ball that is attached to said substrate.

11. The package of claim 8, wherein said decal includes a solder resist material.

12. The package of claim 8, further comprising an encapsulant that encloses said integrated circuit.

13. A method for assembling an integrated circuit package, comprising:

attaching a decal to a substrate which has a substrate coefficient of thermal expansion, said decal having a decal coefficient of thermal expansion that is lower than said substrate coefficient of thermal expansion; and, attaching an integrated circuit to said substrate.

14. The method of claim 13, further comprising attaching a solder ball to said substrate.

15. The method of claim 13, further comprising filling a space between said integrated circuit and said substrate with an underfill material.

16. The method of claim 13, further comprising enclosing said integrated circuit with an encapsulant.

17. A method for assembling an integrated circuit package, comprising:

attaching a decal to a substrate, the decal having a center opening and a coefficient of thermal expansion lower than the coefficient thermal expansion of the substrate;

attaching an integrated circuit to the substrate, wherein there is a space between the substrate and the integrated circuit; and, filling the space and decal opening with an underfill material.

18. The method of claim 17, further comprising attaching a solder ball to said substrate.

19. The method of claim 17, further comprising enclosing said integrated circuit with an encapsulant.

20. The integrated circuit package of claim 1, wherein the decal is a cured resist.

* * * * *